(12) United States Patent
Poechmueller

(10) Patent No.: US 6,674,674 B2
(45) Date of Patent: Jan. 6, 2004

(54) METHOD FOR RECOGNIZING AND REPLACING DEFECTIVE MEMORY CELLS IN A MEMORY

(75) Inventor: Peter Poechmueller, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/164,213

(22) Filed: Jun. 6, 2002

(65) Prior Publication Data

US 2002/0196686 A1 Dec. 26, 2002

(30) Foreign Application Priority Data

Jun. 6, 2001 (DE) ......................................... 101 27 421

(51) Int. Cl.$^7$ .............................................. G11C 29/00
(52) U.S. Cl. ...................................... 365/200; 365/201
(58) Field of Search ................................. 365/200, 201, 365/210

(56) References Cited

U.S. PATENT DOCUMENTS

| | | | | |
|---|---|---|---|---|
| 5,680,544 A | * | 10/1997 | Edmondson et al. | ......... 714/42 |
| 5,983,375 A | * | 11/1999 | Kim et al. | ................... 714/720 |
| 6,061,808 A | | 5/2000 | Yamauchi et al. | ............. 714/6 |
| 6,078,536 A | * | 6/2000 | Moon et al. | ................. 365/201 |
| 6,105,152 A | | 8/2000 | Duesman et al. | ........... 714/718 |

* cited by examiner

Primary Examiner—Richard Elms
Assistant Examiner—Jung H. Hur
(74) Attorney, Agent, or Firm—Laurence A. Greenberg; Werner H. Stemer; Gregory L. Mayback

(57) ABSTRACT

A method for recognizing a defective memory cell in a memory having a plurality of memory cells includes directly comparing predetermined properties of the memory cells to one another. Predetermined identical information is read into each memory cell of the plurality of memory cells, and then the information stored in the plurality of memory cells is read out. For each one of the plurality of memory cells a strength of a read-out signal is determined, and the memory cells are sorted depending on the strength of the respective read-out signal.

13 Claims, 1 Drawing Sheet

METHOD FOR RECOGNIZING AND REPLACING DEFECTIVE MEMORY CELLS IN A MEMORY

BACKGROUND OF THE INVENTION

1. Field of the Invention

The present invention refers to a method for recognizing a defective memory cell in a memory with a plurality of memory cells and to a method for replacing recognized defective memory cells in a memory by redundant memory cells provided in the memory.

2. Description of the Related Art

Current semiconductor memory chips comprise many hundreds of millions of memory cells and can therefore no longer be produced without defects. There are always some defective memory cells in the memory. For that reason redundant memory cells are provided. In expensive test methods defective memory cells are located and finally replaced by redundant cells.

The test methods used in this context consist of reading different data structures into the memory chips and store them and then read them out again. A test device compares the read data with the originally written data. If a difference is determined, the respective cell is recognized as defective and replaced by a redundant cell. Regarding the difference, the replacement of the respective cell with a redundant cell will depend on the degree of deviation.

The problem with these test methods known in the prior art is, that the individual memory cells are only compared very abstractly against data provided by test devices by writing and reading to the memory via the test devices as described above. It is a disadvantage of this arrangement that the test conditions have to be set such that certain quality criteria are achieved in an acceptable yield. An optimum yield is just as unlikely to achieve as an optimum quality of the tested memory element.

SUMMARY OF THE INVENTION

It is the object of the present invention is to provide an improved method for recognizing a defective memory cell in a memory, as well as an improved method for replacing defective memory cells in such a memory, by which an optimum yield and an optimum quality of the memory chip are achievable.

The present invention is a method for recognizing a defective memory cell in a memory with a plurality of memory cells is provided, wherein predetermined properties of the memory cells are compared directly to one another.

According to the present invention a method for replacing defective memory cells in a memory with redundant memory cells provided in the memory is provided, wherein defective memory cells are recognized by a comparison of predetermined physical properties of the memory cells and the recognized memory cells will be replaced with redundant memory cells.

The present invention is based on the finding that instead of test methods known in prior art, where the individual memory cells are compared to test devices only very abstractly, an improved yield and quality of the corrected memory elements is achievable by comparing the memory cells directly to one another, in deviation from known test approaches. For the first time, the present invention provides the possibility of a direct comparison of memory cells to one another, wherein by a clever utilization of present circuit parts practically no additional chip space on known memory elements is necessary for the realization of the inventive method.

This is achieved by utilizing the existing structure of bit lines, word line decoders and "sense" amplifiers for the direct comparison of memory cells. Only an addition of relatively simple logic circuit elements is necessary, that can generally be placed under already existing bus structures. Thereby, the resulting chip size is practically not influenced.

It is an advantage of the present invention that the direct comparison of predetermined properties of memory cells in a memory is made possible for the first time. It is another advantage that a practically cost free realization is made possible, since no additional chip space is necessary, due to the above-mentioned reasons.

According to a preferred embodiment of the present invention the properties of the memory cells are compared directly to one another and as a result of this comparison a monotonous series is generated, starting with the strongest memory cell and going to the weakest memory cell. According to another embodiment of the present invention it will then be possible, with the redundancy present on the memory chip, to repair defective memory cells beginning with the weakest memory cell until the whole redundancy is used up, whereby the optimum yield of memory chips with the highest quality can be achieved, since it is made sure that all redundant memory cells are used, whereas in the prior art due to the set minimum quality criteria there is a danger with the acceptable yield that redundant memory cells are not used, since certain memory cells just about achieve the minimum quality criteria. The advantage of the present invention regarding this approach is obvious, since here memory cells that would just about fulfil the minimum quality criteria are also replaced by functional redundant memory cells so that the overall quality of the memory chip is improved.

BRIEF DESCRIPTION OF THE DRAWINGS

These and other objects and features of the present invention will become clear from the following description taken in conjunction with the accompanying drawing, in which.

DESCRIPTION OF THE PREFERRED EMBODIMENTS

Figure 1:
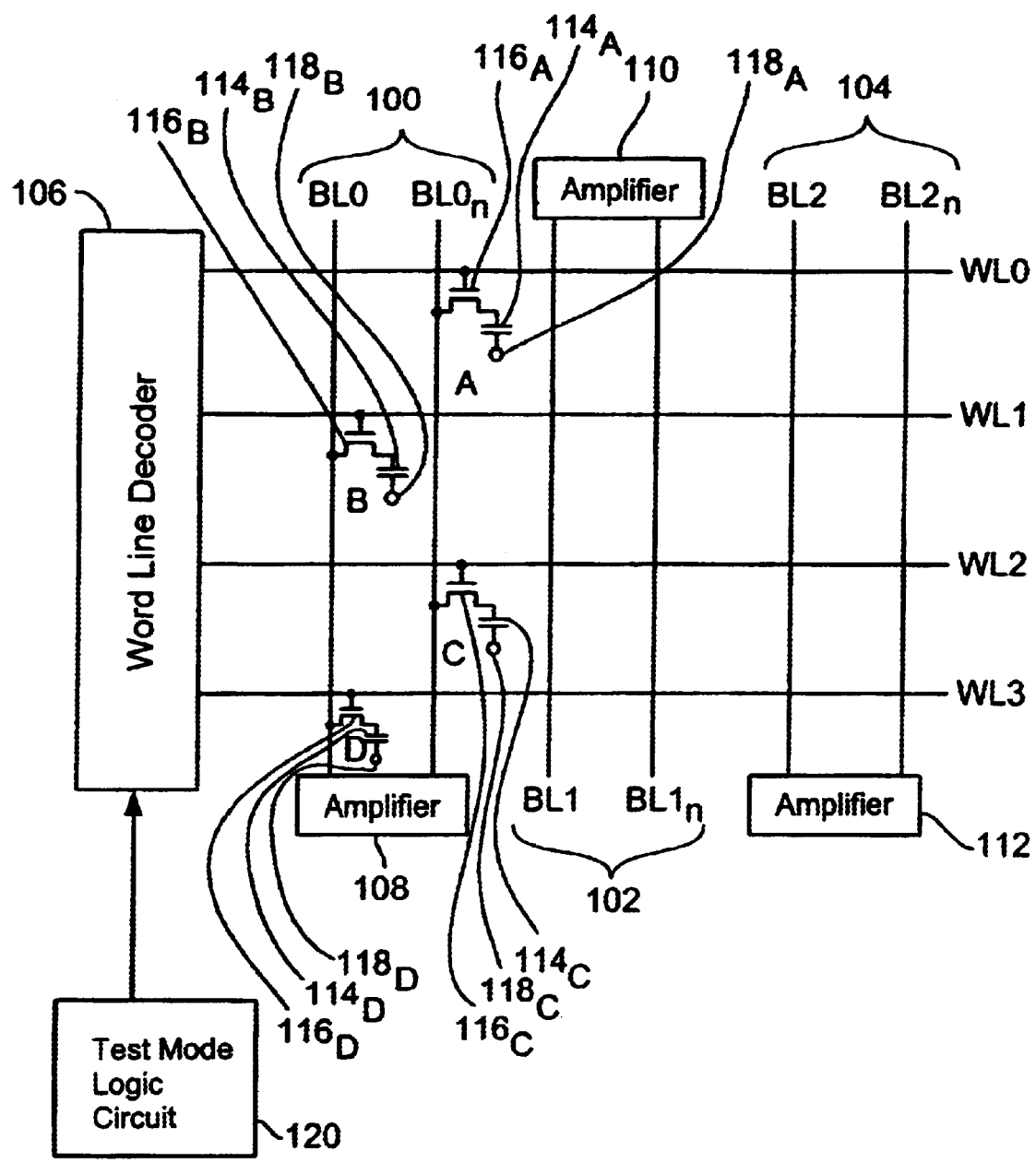
FIG. 1 is a schematic representation of a DRAM memory field.

Before the description of the present invention proceeds it is noted that elements in the accompanying drawing are designated by the following reference signs

| | |
|---|---|
| BL0 | first bit line |
| BL1 | first bit line |
| BL2 | first bit line |
| BL0$_n$ | second bit line |
| BL1$_n$ | second bit line |
| BL2$_n$ | second bit line |
| WL0 | word line |
| WL1 | word line |
| WL2 | word line |
| WL3 | word line |
| 100 | bit line pairs |
| 102 | bit line pairs |
| 104 | bit line pairs |
| 106 | word line decoder |

-continued

| | |
|---|---|
| 108 | amplifier |
| 110 | amplifier |
| 112 | amplifier |
| $114_A$ | capacitive devices |
| $114_B$ | capacitive devices |
| $114_C$ | capacitive devices |
| $114_D$ | capacitive devices |
| $116_A$ | switching transistor |
| $116_B$ | switching transistor |
| $116_C$ | switching transistor |
| $116_D$ | switching transistor |
| $118_A$ | terminal |
| $118_B$ | terminal |
| $118_C$ | terminal |
| $118_D$ | terminal |
| 120 | test mode logic circuit |

The DRAM memory field (DRAM=dynamic random access memory) shown in FIG. 1 comprises four word lines WL0, WL1, WL2 and WL3 as well as three bit line pairs 100, 102 and 104. The bit line pair 100 comprises a first bit line BL0 and a second bit line $BL0_n$. The second bit line pair 102 comprises a first bit line BL1 and a second bit line $BL1_n$. The third bit line pair 104 comprises a first bit line BL2 and a second bit line $BL2_n$.

The word lines WL0 to WL3 are connected to a word line decoder 106, causing activation of chosen word lines WL0 to WL3, depending on respective control signals.

A first amplifier 108 is associated to the bit line pair 100, a second amplifier 110 is associated to the bit line pair 102 and a third amplifier 112 is associated to the bit line pair 104, the amplifiers are so-called "sense" amplifiers amplifying weak signals present on the bit lines of the associated bit line pairs.

By the four word lines WL0 to WL3 and the three bit line pairs 100 to 104 a memory field of twelve memory cells is formed, wherein for simplification of the representation in FIG. 1 only four memory cells A, B, C and D are schematically illustrated. The memory cell A comprises a capacitive device $114_A$, connected between a switching transistor $116_A$ and a terminal $118_A$. The memory cell A is connected between the first word line WL0 and the second bit line $BL0_n$ of the first bit line pair 100, wherein a control terminal of the switching transistor $116_A$ is connected to the word line WL0, and the third terminal of the switching transistor $116_A$ is connected to the second bit line $BL0_n$ of the first bit line pair 100.

The memory cell B also comprises a capacitive device $114_B$, a switching transistor $116_B$ and a terminal $118_B$, wherein the capacitive device $114_B$ is connected between the switching transistor $116_B$ and the terminal $118_B$. The memory cell B is connected between the second word line WL1 and the first bit line BL0 of the first bit line pair 100, wherein a control terminal of the switching transistor $116_B$ is connected to the second word line WL1, and a third terminal of the switching transistor $116_B$ is connected to the first bit line BL0 of the first bit line pair 100.

The memory cell C comprises a capacitive device $114_C$, connected between a terminal $118_C$ and a switching transistor $116_C$. The memory cell C is disposed between the third word line WL2 and the second bit line $BL0_n$ of the first bit line pair, wherein a control terminal of the switching transistor $116_C$ is connected to the third word line WL2, and a third terminal of the switching transistor $116_C$ is connected to the second bit line $BL0_n$ of the first bit line pair 100.

The memory cell D comprises a capacitive device $114_D$, connected between a terminal $118_D$ and a switching transistor $116_D$. The memory cell D is connected between the fourth word line WL3 and the first bit line BL0 of the first bit line pair 100, wherein a control terminal of the switching transistor $116_D$ is connected to the fourth word line WL3 and a third terminal of the switching transistor $116_D$ is connected to the first bit line BL0 of the first bit line pair 100.

To keep the representation in FIG. 1 clear, the representation of the other memory cells has been left out, they are, however, all built the same way as the illustrated memory cells and are respectively associated to the individual bit lines of the bit line pairs 102 and 104.

The memory cells A and C are read out/written to via the second bit line $BL0_n$ of the first bit line pair 100, and the memory cells B and D are read out/written to via the first bit line BL0 of the first bit line pair 100.

Reading a memory cell is accomplished by activating a word line controlled by the word line decoder 106. It is assumed that the word line WL0 has been activated, whereby the switching transistor or selection transistor $100_A$ of the memory cell A has been activated, whereby the memory capacity $114_A$ of the memory cell A is connected to the second bit line $BL0_n$ of the first bit line pair 100. Prior to the activation of the selection transistor $116_A$ the first bit line BL0 and the second bit line $BL0_n$ of the first bit line pair 100 are brought to an equal voltage level of e.g. one volt. Depending on which information has been stored in the memory cell A, e.g. 0 volt or 2 volt, a slight voltage change results on the second bit line $BL0_n$ of the first bit line pair in comparison to the first bit line BL0 of the first bit line pair. This change is typically very low, since the line capacity of the bit line $BL0_n$ is significantly higher than the capacity of the capacitive device $114_A$. Therefore, the low voltage difference between the two bit lines BL0 and $BL0_n$ has to be amplified after reading out the memory cell A via the amplifier 108.

In the prior art the just read out information, a 0 or a 1 would be captured via the test device and compared to the expected value, wherein the expected value is the information value originally written into memory cell A via the test device. Depending on this comparison memory cell A would be classified as error free or defective, by using the above described minimum quality criteria.

In contrast to this disadvantageous approach, the present invention teaches a totally different and novel test method, namely the direct comparison of memory cells or of properties of memory cells, respectively.

For that reason, according to the present invention, at first the same information is written into all memory cells to be compared, e.g. into the memory cells A to D. It is assumed that a "1" has been written into the memory cells A and B, e.g. in form of a voltage potential of 2 volt. Afterwards, the word lines WL0 and WL1 are activated at the same time, which is realised by controlling the word line decoder 106 by an inventive test mode logic circuit 120. By this controlling the memory capacities $114_A$ and $114_B$ of the memory cells A and B are connected to the second bit line $BL0_n$ or the first bit line BL0 of the first bit line pair 100, respectively. Ideally the same voltage level would arise on both bit lines. Due to the fact that the memory cells A and B have a different quality, e.g. due to different capacity values or different voltage losses, a small voltage difference will appear between the first bit line BL0 and a second bit line $BL0_n$. This small voltage difference can be determined and be read out by activating the present amplifier 108. The read out information describes thus, which of the memory cells A or B is stronger, which means which is the memory cell with the strongest output signal.

For the determination of memory cells along one bit line pair generating the weakest output signals different algorithms can be developed, wherein in the embodiment described referring to FIG. 1 a direct comparison of memory cells along a single bit line, which means a direct comparison of memory cells A and C and memory cells B and D, respectively, is not possible. This poses no problem in practice, however, since memory cells having significant weaknesses of their output signals are always found during the comparison to the many memory cells, in today's memory architectures are already up to 256, of the opposite or associated bit line of the bit line pairs.

For the embodiment illustrated in FIG. 1 it is assumed exemplarily, that memory cells A to D have output signals with the following strengths:

A>B>D>C, which means that memory cell A generates the strongest output signal, followed by memory cell B and memory cell D, wherein memory cell C outputs the weakest output signal.

An exemplary comparison algorithm could therefore be:
1. Compare the memory cells pair by pair, and
2. Take the strongest cell from every pair and carry out these steps until only one cell is left.

To implement this algorithm, the test mode logic circuit 120 first causes an activation of the first word line WL0 and the second word line WL1, wherein the output signals of the amplifier 108 show that the output signal of memory cell A is greater than the output signal of memory cell B, which shows that the weaker memory cell is associated to the second word line WL1. Then, the third word line WL2 and the fourth word line WL3 are activated, wherein it can be derived from the output signal of the amplifier that the output signal of memory circuit D is stronger than the output signal of memory circuit C, so that the weaker memory cell is associated to the third word line WL2.

In a subsequent step, after the stronger memory cells have been excluded for further examination, the second word line WL1 and the fourth word line WL3 will be activated, and the output signal of the amplifier 108 shows that the output signal of memory cell B is greater than the output signal of memory cell C, which means that memory cell C is the memory cell with the weakest output signal, therefore the weakest output cell.

In n word lines this algorithm already leads to a result after $\log_2 n+1$ comparisons.

By appropriately storing the test results, monotonous sequences of memory cells can be generated in the test mode logic circuit 120, beginning with the memory cell with the strongest output signal and ending with the memory cell with the weakest or lowest output signal.

Now, for example a replacement of memory cells can be achieved, independently of predetermined quality criteria, by replacing them with redundant memory cells provided in the memory element, beginning with the memory cell with the weakest output signal. The replacing can be continued until all redundant memory cells are used up, are until a memory cell is met whose output signal strength is above a predetermined threshold.

The present invention has been discussed referring to a detailed embodiment, wherein the charges contained in the memory cells have been compared via the voltage signals applied to the bit lines. However, the present invention is not limited to such an embodiment, but it discloses, according to the new approach, a recognition of defective memory cells by a comparison of predetermined properties of the memory cells, preferably predetermined electrical properties of memory cells.

Although referring to FIG. 1 an embodiment has been described by using a DRAM, the present invention can be applied to every semiconductor memory, such as a FRAM, a NRAM or a flash memory.

Although several embodiments of the invention have been illustrated, and their forms described, it is readily apparent to those skilled in the art that various modifications my be made therein without departing from the spirit of the invention or the scope of the appended claims.

What is claimed is:

1. A method for recognizing a defective memory cell in a memory with a plurality of memory cells, which comprises:
   comparing output signals of the memory cells directly to one another; and
   sorting the memory cells depending on the strength of the respective output signal.

2. The method according to claim 1, wherein always two memory cells are compared to one another.

3. The method according to claim 1, wherein the steps of comparing and sorting the memory cells depending on the strength of the respective output signal, is performed by:
   (i) writing a predetermined identical information into each memory cell of the plurality of memory cells; Me
   (ii) reading out the information stored in the plurality of memory cells;
   (iii) for each of the plurality of memory cells, determining the strength of the output signal from step (ii); and
   (iv) depending on the strengths determined in step (iii), sorting the memory cells depending on the strength of the respective output signal.

4. The method according to claim 3, wherein the step (iv) comprises the following steps:
   comparing the signal strengths of one pair of memory cells of the plurality of memory cells, respectively;
   determining the memory cell in each pair having the highest signal strength and removing it from the plurality of memory cells; and
   repeating the previous steps with the remaining memory cells.

5. The method according to claim 1, wherein all memory cells, whose associated output signals have a value below a predetermined threshold, are classified as defective.

6. The method according to claim 1, wherein the memory comprises a plurality of word lines and a plurality of bit line pairs, wherein each bit line pair has a first bit line and a second bit line, wherein a memory cell is associated to a word line and a bit line of the bit line pair, wherein memory cells of the first bit line are compared to memory cells of the second bit line for recognising the defective memory cell.

7. A method for replacing defective memory cells in a memory with redundant memory cells provided in the memory, comprising:
   recognizing the defective memory cells by directly comparing predetermined properties of the memory cells to one another; and
   replacing the defective memory cells with the redundant memory cells starting with the defective memory cell having the lowest signal strength.

8. The method according to claim 7, wherein the defective memory cells are replaced until all the redundant memory cells are used up, or wherein the defective memory cells whose signal strength is below a predetermined threshold are replaced.

9. A method for recognizing a defective memory cell in a memory with a plurality of memory cells, wherein predetermined properties of the memory cells are compared directly to one another, which comprises:

(i) writing a predetermined identical information into each memory cell of the plurality of memory cells;

(ii) reading out the information stored in the plurality of memory cells;

(iii) for each of the plurality of memory cells, determining the strength of a read out signal from step (ii); and (iv) depending on the strengths determined in step (iii), sorting the memory cells depending on the strength of the respective read out signal.

10. The method according to claim 9, wherein always two memory cells are compared to one another.

11. The method according to claim 9, wherein all memory cells, whose associated read out signals have a value below a predetermined threshold, are classified as defective.

12. The method according to claim 9 wherein the step (iv) comprises the following steps:

comparing the signal strengths of one pair of memory cells of the plurality of memory cells, respectively;

determining the memory cell in each pair having a highest signal strength and removing it from the plurality of memory cells; and repeating the previous steps with the remaining memory cells.

13. The method according to claim 9, wherein the memory comprises a plurality of word lines and a plurality of bit line pairs, wherein each bit line pair has a first bit line and a second bit line wherein a memory cell is associated to a word line and a bit line of the bit line pair, wherein memory cells of the first bit line are compared to memory cells of the second bit line for recognising the defective memory cell.

* * * * *